United States Patent
Ametowobla et al.

(10) Patent No.: US 9,914,640 B2
(45) Date of Patent: Mar. 13, 2018

(54) TARGETED CONTROL OF THE ABSORPTION BEHAVIOR DURING LASER RESEALING

(71) Applicant: Robert Bosch GmbH, Stuttgart (DE)

(72) Inventors: Mawuli Ametowobla, Stuttgart (DE); Philip Kappe, Hildesheim (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 15/358,733

(22) Filed: Nov. 22, 2016

(65) Prior Publication Data
US 2017/0158498 A1    Jun. 8, 2017

(30) Foreign Application Priority Data

Dec. 8, 2015 (DE) .......... 10 2015 224 483

(51) Int. Cl.
*B81C 1/00* (2006.01)
*B81B 7/02* (2006.01)

(52) U.S. Cl.
CPC ............ *B81C 1/00325* (2013.01); *B81B 7/02* (2013.01); *B81B 2201/0235* (2013.01); *B81B 2201/0242* (2013.01); *B81C 2203/0109* (2013.01); *B81C 2203/0145* (2013.01); *B81C 2203/0181* (2013.01)

(58) Field of Classification Search
CPC ........ B81C 2203/0145; B81C 2203/01; B81C 2203/0109; B81C 1/00261; B81C 1/00277; B81C 1/00293; B81B 7/0032; B81B 7/0035; B81B 7/0041; B81B 7/0045; B81B 7/0051; B81B 2201/0235; B81B 2201/0242; B81B 2201/025; B81B 2203/0315
See application file for complete search history.

(56) References Cited

U.S. PATENT DOCUMENTS 7,723,141 B2 * 5/2010 Robert ................ B81C 1/00293
257/E21.567
8,304,845 B2 * 11/2012 Bischof ............... B81C 1/00293
257/415

(Continued)

FOREIGN PATENT DOCUMENTS

WO    2015/120939 A1    8/2015

*Primary Examiner* — Scott B Geyer
(74) *Attorney, Agent, or Firm* — Norton Rose Fulbright US LLP; Gerard Messina

(57) ABSTRACT

A method for manufacturing a micromechanical component including a substrate and a cap, which is connected to the substrate and, together with the substrate, encloses a first cavity, a first pressure prevailing and a first gas mixture having a first chemical composition being enclosed in the first cavity, includes in a first task, an access opening connecting the first cavity to surroundings of the component is formed in the substrate or cap, in a second task, the first pressure and/or the first chemical composition is adjusted in the first cavity, in a third task, the access opening is sealed by introducing energy or heat into an absorbing part of the substrate or cap with a laser, the introduction of the energy or heat occurring by adjusting the extension of the absorbing part and adjusting the absorption strength in the absorbing part to minimize stresses occurring in the substrate or cap.

9 Claims, 3 Drawing Sheets

(56) References Cited

U.S. PATENT DOCUMENTS

| | | | |
|---|---|---|---|
| 8,424,343 B2* | 4/2013 | Chen | B81C 1/00293 |
| | | | 65/34 |
| 8,962,069 B2* | 2/2015 | Pornin | B81C 1/00285 |
| | | | 427/96.2 |
| 9,038,463 B2* | 5/2015 | Takizawa | B81B 7/0041 |
| | | | 73/430 |
| 9,247,664 B2* | 1/2016 | Takizawa | H05K 5/069 |
| 9,428,378 B2* | 8/2016 | Heuck | B81B 7/02 |
| 2005/0116245 A1* | 6/2005 | Aitken | C03B 23/245 |
| | | | 257/99 |

* cited by examiner

TARGETED CONTROL OF THE ABSORPTION BEHAVIOR DURING LASER RESEALING

RELATED APPLICATION INFORMATION

The present application claims priority to and the benefit of German patent application no. 10 2015 224 483.0, which was filed in Germany on Dec. 8, 2015, the disclosure of which is incorporated herein by reference.

FIELD OF THE INVENTION

The present invention is directed to a method according to the description herein.

BACKGROUND INFORMATION

Such a method is discussed in WO 2015/120939 A1. When a certain internal pressure is desired in a cavity of a micromechanical component or a gas mixture having a certain chemical composition is to be enclosed in the cavity, the internal pressure or the chemical composition is frequently adjusted during capping of the micromechanical component or during the bonding process between a substrate wafer and a cap wafer. During capping, for example, a cap is connected to a substrate, whereby the cap and the substrate together enclose the cavity. By adjusting the atmosphere or the pressure and/or the chemical composition of the gas mixture present in the surroundings during capping, it is thus possible to adjust the particular internal pressure and/or the particular chemical composition in the cavity.

With the aid of the method of WO 2015/120939 A1, an internal pressure may be adjusted in a targeted way in a cavity of a micromechanical component. It is in particular possible with the aid of this method to manufacture a micromechanical component having a first cavity, a first pressure and a first chemical composition being adjustable in the first cavity, which differ from a second pressure and a second chemical composition at the time of capping.

In the method for targeted adjusting of an internal pressure in a cavity of a micromechanical component according to WO 2015/120939 A1, a narrow access channel to the cavity is created in the cap or in the cap wafer, or in the substrate or in the sensor wafer. Subsequently, the cavity is flooded with the desired gas and the desired internal pressure via the access channel. Finally, the area around the access channel is locally heated with the aid of a laser, the substrate material liquefies locally and hermetically seals the access channel during solidification.

SUMMARY OF THE INVENTION

It is an object of the present invention to provide a method for manufacturing a micromechanical component which is mechanically robust and has a long service life compared to the related art, in a simple and cost-effective manner compared to the related art. It is a further object of the present invention to provide a micromechanical component which is compact, mechanically robust and has a long service life compared to the related art. According to the present invention, this applies, in particular, to a micromechanical component that includes one (first) cavity. With the aid of the method according to the present invention and the micromechanical component according to the present invention, it is furthermore also possible to implement a micromechanical component in which a first pressure and a first chemical composition may be adjusted in the first cavity, and a second pressure and a second chemical composition may be adjusted in a second cavity. For example, such a method for manufacturing micromechanical components is provided, for which it is advantageous if a first pressure is enclosed in a first cavity and a second pressure is enclosed in a second cavity, the first pressure being different from the second pressure. This is the case, for example, when a first sensor unit for rotation rate measurement and a second sensor unit for acceleration measurement are to be integrated into a micromechanical component.

The object may be achieved in that the introduction of the energy or heat takes place by adjusting the extension of the absorbing part and by adjusting the absorption strength in the absorbing part in order to minimize stresses occurring in the substrate or in the cap.

In this way, a method for manufacturing a micromechanical component is provided in a simple and cost-effective manner, with the aid of which the introduction of the energy or heat is controllable spatially in the substrate or in the cap. Thus, a first transition of the material area from the solid aggregate state into the liquid aggregate state and a chronologically subsequent second transition of the material area from the liquid aggregate state into the solid aggregate state in the substrate or in the cap may be controlled in a spatially targeted manner. Moreover, because of the spatial distribution of the energy or heat within the substrate or the cap, it is possible with the method according to the present invention to raise, compared to the related art, the temperature of areas of the substrate or of the cap adjacent to the material area of the substrate or cap in a spatially targeted manner. Thus, it is possible to reduce the temperature gradients in the substrate or in the cap, in particular, in the area of the access opening, compared to the related art. This allows the heat expansion during a temperature increase and/or heat shrinkage during a temperature drop of adjoining areas in the substrate or in the cap, in particular, in the area of the access opening, to be adapted to one another and, thus, allows mechanical stresses and internal stresses, which occur in the area of the sealed access opening, in particular, as a result of the cooling process after the third method step, to be reduced, compared to the related art. The relief or reduction of locally occurring stresses or tensions is particularly advantageous, since the resistance to crack formation may therefore be increased and the probability of a component failure immediately after closure of the access opening, during the further processing of the micromechanical component or during the product service life, may be reduced compared to the related art. The avoidance of cracks enables, in particular, a hermetic seal of the access opening and thus reduces the probability of a limitation of the functionality of the micromechanical component by an unsealed closure of the access opening compared to the related art.

With the method according to the present invention, it is possible to reduce temperature gradients, in particular, between the first only recently solidified material area and the material surrounding the material area compared to the related art by a spatially targeted increase of the temperature in the substrate or in the cap. These temperature gradients may be reduced, in particular, at the time of solidification of the material area and shortly after the solidification of the material area. This makes it advantageously possible for the heat shrinkage of the material area to essentially correspond to the heat shrinkage of the material surrounding the material area or the two heat shrinkages to be adapted to one another. This therefore advantageously allows mechanical stresses occurring in the area of the sealed access opening, in particular, subsequent to the cooling of the material area, to be reduced, compared to the related art.

According to the present invention, temperature gradients are less critical at a point in time at which the material area is in a liquid aggregate state or in the melting state, since the material area at this point in time is essentially free of stresses. According to the present invention, however, it is provided, for example, that the temperature gradients are reduced compared to the related art, even at the point in time at which the material area is in the liquid aggregate state. According to the present invention, stresses accumulating subsequent to solidification of the material area because the only recently solidified material area is significantly hotter or much hotter than the material surrounding the material area and, as a result, experiences a thermal expansion during the cooling process sharper than/different from the colder material surrounding the material area, are, in particular, prevented or reduced. According to the present invention, it is provided that the temperature gradient in the material and in the substrate or in the cap may be held to a minimum during the solidification of the material area and during cooling, so that mechanical stresses remaining in the component after cooling may be minimal.

A further advantage of the method according to the present invention is that the movement of dislocations is thermally activatable with the aid of the targeted spatial introduction of the energy and heat into the substrate or into the cap. Thus, it is advantageously possible as a result of thermally activated dislocation movements or of facilitated dislocation movements for the substrate or the cap to be plastically deformable, at least partially or at least partially locally in the area of the access opening, in particular, subsequent to the second transition. Thus, as a result of plastic deformation, it is possible to reduce or relieve locally occurring stresses or stress peaks with the aid of the targeted introduction of the energy or heat compared to the related art.

The method according to the present invention is particularly advantageous for a method, in which a laser spot welding method is applied in the third method step, since with the method according to the present invention, stresses introduced into the material locally in the area of the access opening or in the area of the sealed access opening due to spot welding may be effectively reduced or redistributed to areas further removed from the access opening. The relief or reduction of locally occurring stresses is particularly advantageous, since the resistance to crack formation may therefore be increased compared to the related art, and thus the probability of a component failure immediately after the sealing of the access opening, during the further processing of the micromechanical component or during the product service life may be reduced compared to the related art.

According to the present invention, the extension of the absorbing part means, for example, an extension of the absorbing part essentially perpendicular to the main extension plane. Alternatively or in addition, the extension of the absorbing part means, for example, an extension of the absorbing part essentially in parallel to the main extension plane. This means, in particular, an area of the substrate or of the cap, in which the absorption of the energy or heat is greater than zero or greater than a predefined absorption of the energy or heat. Absorption strength is understood in the context of the present invention to mean, for example, a strength distribution within the absorbing area extending spatially essentially perpendicular to the main extension plane. Alternatively or in addition, absorption strength is understood to mean, for example, a strength distribution within the absorbing area extending spatially essentially in parallel to the main extension plane. The absorption strength values of the strength distribution in such a case may be adjusted in a spatially targeted manner. It is provided in such a case, for example, that the strength distribution is constant or varying with increasing distance from a surface of the substrate or of the cap facing away from the first cavity. It is provided, for example, that the absorption strength steadily decreases with increasing distance from the surface of the substrate or of the cap facing away from the first cavity.

It is provided in this case, for example, that 90% of the absorption in the substrate or in the cap occurs in an area between the surface and a distance of 1 µm from the surface. In addition, it is also provided, for example, that the absorption strength decreases essentially exponentially with increasing distance from the surface of the substrate or of the cap facing away from the first cavity. In this case, it is provided, for example, that 90% of the absorption in the substrate or in the cap occurs in an area between the surface and a distance of 1 µm from the surface. It is also provided, for example, that the absorption strength initially increases with increasing distance from the surface of the substrate or of the cap facing away from the first cavity, then passes through a maximum and subsequently decreases. In this case, it is provided, for example, that 90% of the absorption in the substrate or in the cap occurs in an area between a distance of 1 µm from the surface and a distance of 50 µm from the surface, which may be between a distance of 5 µm from the surface and a distance of 30 µm, particularly between a distance of 10 µm from the surface and a distance of 20 µm from the surface. It is further provided, for example, that the absorption strength is initially constant with increasing distance from the surface of the substrate or of the cap facing away from the first cavity, then decreases and is subsequently essentially constant. In this case, it is provided, for example, that 90% of the absorption in the substrate or in the cap occurs in an area between the surface and a distance of 1 µm from the surface. The extension of the absorbing part and absorption strength in the absorbing part as described above advantageously allows the introduction of the energy or heat to be controllable essentially three-dimensionally in the substrate or in the cap. Finally, the absorbing part means an area of the substrate or of the cap, in which 90% of the absorption occurs in the substrate or in the cap.

The term "micromechanical component" is understood in the context of the present invention to mean that the term includes both micromechanical components as well as microelectromechanical components.

The present invention may be provided for the manufacture of a micromechanical component or for the manufacture of a micromechanical component including a cavity. However, the present invention is also provided, for example, for a micromechanical component including two cavities or including more than two, i.e., three, four, five, six or more than six, cavities.

The access opening may be sealed with the aid of a laser by introducing energy or heat into a part of the substrate or of the cap that absorbs this energy or this heat. In this case, energy or heat may be introduced chronologically in succession into the respective absorbing part of the substrate or of the cap of multiple micromechanical components, which are manufactured together, for example, on one wafer. Alternatively, however, a chronologically parallel introduction of the energy or heat into the respective absorbing part of the substrate or of the cap of multiple micromechanical components is also provided, for example, using multiple laser beams or laser devices.

Advantageous embodiments and refinements of the present invention are found in the subclaims, as well as in the description with reference to the drawings.

According to one refinement, it is provided that the cap together with the substrate, enclose a second cavity, a second pressure prevailing and a second gas mixture having a second chemical composition being enclosed in the second cavity.

According to one refinement, it is provided that the adjustment of the extension of the absorbing part and the adjustment of the absorption strength in the absorbing part take place as a function of an applied laser wavelength of a laser beam. This advantageously allows the global absorption behavior of the substrate or of the cap to be utilized in order to introduce the energy or heat into the substrate or into the cap in a targeted manner.

The laser beam is understood in the context of the present invention to mean electromagnetic radiation emitted continuously or non-continuously from a laser. The laser may, for example, be a pulse laser or also a continuous wave laser. It is also provided according to the present invention that the continuous wave laser is operated in such a way that the electromagnetic radiation is continuously emitted or continuously strikes the absorbing part of the substrate or of the cap. It is also provided that the electromagnetic radiation strikes the absorbing part of the substrate or of the cap and is at least partially absorbed by this part.

According to one refinement, it is provided that the adjustment of the extension of the absorbing part and the adjustment of the absorption strength in the absorbing part take place as a function of a material of the substrate or of the cap. This advantageously makes it possible for spatially structured absorption behaviors to be adjusted.

According to one refinement, it is provided that the adjustment of the extension of the absorbing part and the adjustment of the absorption strength in the absorbing part take place as a function of a doping of the substrate or of the cap. As a result, it is advantageously possible to adjust the extension of the absorbing area and the absorption strength in the absorbing area in a particularly precise manner.

According to one refinement, it is provided that the adjustment of the extension of the absorbing part and the adjustment of the absorption strength in the absorbing part take place as a function of a temperature of the substrate or of the cap. In this way, a further option for influencing the global absorption behavior of the substrate or of the cap is advantageously provided.

According to one refinement, it is provided that the adjustment of the extension of the absorbing part and the adjustment of the absorption strength in the absorbing part take place as a function of a layer and/or a structure in the substrate and/or on the substrate or in the cap and/or on the cap. In this way, it is advantageously possible to provide different depth profiles of the absorbing part and different absorption strengths within the depth profiles.

According to one refinement, it is provided that the adjustment of the extension of the absorbing part and the adjustment of the absorption strength in the absorbing part take place as a function of the layer and/or the structure in such a way that the layer and/or the structure is a deposited layer and/or structure. This advantageously makes it possible to produce different depth profiles using methods of layer technology known from the related art.

According to one refinement, it is provided that the adjustment of the extension of the absorbing part and the adjustment of the absorption strength in the absorbing part take place as a function of the layer and/or of the structure in such a way that the layer and/or structure is a doped layer and/or doped structure. This advantageously allows the degree of absorption to be adjustable in a highly sensitive manner.

A further subject matter of the present invention is a micromechanical component having a substrate and a cap connected to the substrate and, together with the substrate, enclosing a first cavity, a first pressure prevailing and a first gas mixture having a first chemical composition being enclosed in the first cavity, the substrate or the cap including a sealed access opening, the substrate or the cap including a material area that solidifies and seals the access opening in order to minimize stresses occurring in the substrate or in the cap after an introduction of energy and heat into an absorbing part of the substrate or of the cap by adjusting the extension of the absorbing part and by adjusting the absorption strength in the absorbing part. This advantageously provides a compact, mechanically robust and cost-effective micromechanical component having an adjusted first pressure. The aforementioned advantages of the method according to the present invention also apply correspondingly to the micromechanical component according to the present invention.

According to one refinement, it is provided that the micromechanical component includes
- a material of the substrate or of the cap for introducing the energy or the heat and/or
- a doping of the substrate or of the cap for introducing the energy or heat and/or
- a layer and/or structure in the substrate and/or on the substrate or in the cap and/or on the cap for introducing the energy or heat. This advantageously allows the micromechanical component to have particularly minimal mechanical stresses or merely mechanical stresses below a critical mechanical stress level in the area of the access opening and is therefore particularly robust with respect to crack formation.

According to one refinement, it is provided that the cap, together with the substrate, encloses a second cavity, a second pressure prevailing and a second gas mixture having a second chemical composition being enclosed in the second cavity. In this way a compact, mechanically robust and cost-effective micromechanical component having an adjusted first pressure and second pressure is advantageously provided.

According to one refinement, it is provided that the first pressure is lower than the second pressure, a first sensor unit for rotation rate measurement being situated in the first cavity, and a second sensor unit for acceleration measurement being situated in the second cavity. In this way, a mechanically robust micromechanical component for rotation rate measurement and acceleration measurement, having optimal operating conditions for both the first sensor unit and the second sensor unit, is advantageously provided.

DETAILED DESCRIPTION

Figure 1:
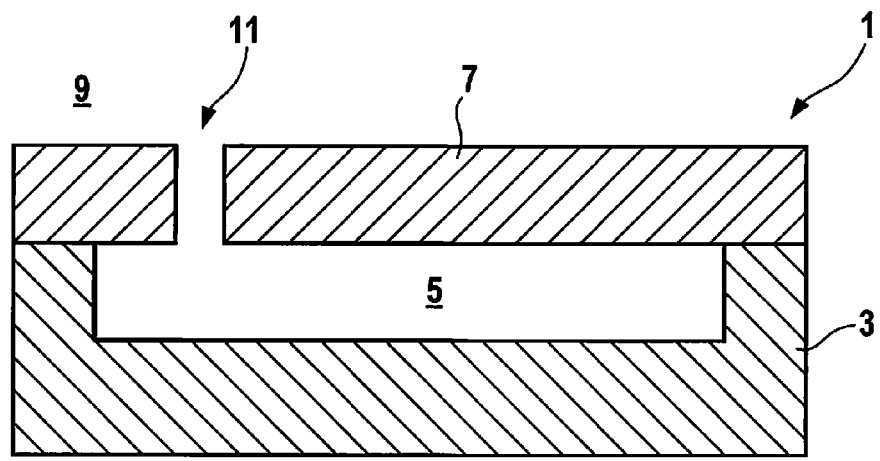
FIG. 1 shows a micromechanical component having an open access opening according to one exemplary specific embodiment of the present invention in a schematic representation.

Identical parts are always denoted by the same reference numerals in the various figures and are therefore generally also cited or mentioned only once.

Figure 2:
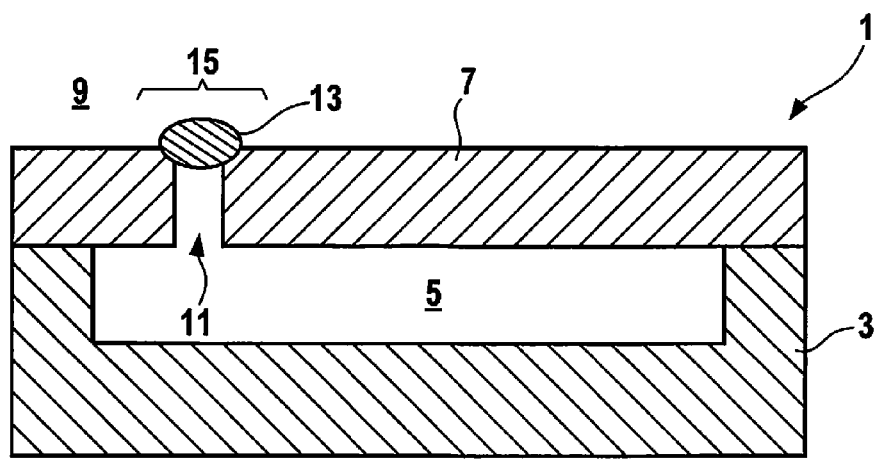
FIG. 2 shows the micromechanical component according to FIG. 1 having a sealed access opening in a schematic representation.

FIG. 1 and FIG. 2 show schematic representations of a micromechanical component 1 having an open access opening 11 in FIG. 1, and having a sealed access opening 11 in FIG. 2, according to one exemplary specific embodiment of the present invention. Micromechanical component 1 includes a substrate 3 and a cap 7. Substrate 3 and cap 7 are, which may be hermetically, connected to one another and together enclose a first cavity 5. For example, micromechanical component 1 is configured in such a way that substrate 3 and cap 7 additionally together enclose a second cavity. The second cavity, however, is not shown in FIG. 1 and in FIG. 2.

For example, a first pressure prevails in first cavity 5, in particular when access opening 11 is sealed, as shown in FIG. 2. Moreover, a first gas mixture having a first chemical composition is enclosed in first cavity 5. In addition, for example, a second pressure prevails in the second cavity, and a second gas mixture having a second chemical composition is enclosed in the second cavity. Access opening 11 may be situated in substrate 3 or in cap 7. In the present exemplary embodiment, access opening 11 is situated in cap 7 by way of example. According to the present invention, however, it may also be alternatively provided that access opening 11 is situated in substrate 3.

It is provided, for example, that the first pressure in first cavity 5 is lower than the second pressure in the second cavity. It is also provided, for example, that a first micromechanical sensor unit for rotation rate measurement, which is not shown in FIG. 1 and FIG. 2, is situated in first cavity 5, and a second micromechanical sensor unit for acceleration measurement, which is not shown in FIG. 1 and FIG. 2, is situated in the second cavity.

Figure 3:
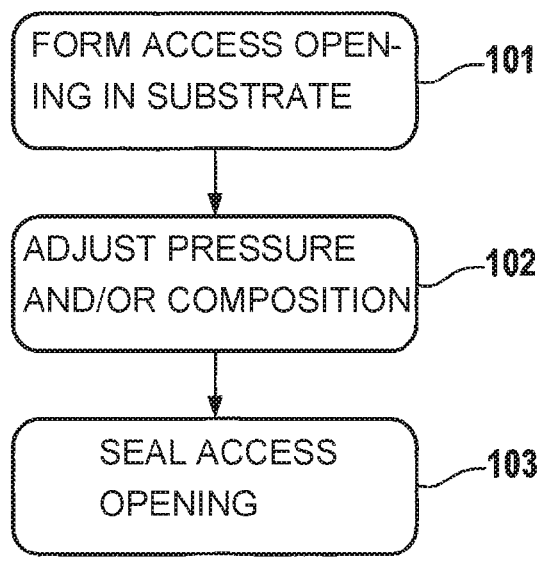
FIG. 3 shows a method for manufacturing a micromechanical component according to one exemplary specific embodiment of the present invention in a schematic representation.

FIG. 3 shows a method for manufacturing micromechanical component 1 according to one exemplary specific embodiment of the present invention in a schematic representation. In this method, in a first method step 101, in particular narrow access opening 11 connecting first cavity 5 to surroundings 9 of micromechanical component 1 is formed in substrate 3 or in cap 7. FIG. 1 shows micromechanical component 1 after first method step 101 by way of example. Moreover, in a second method step 102, the first pressure and/or the first chemical composition in first cavity 5 is adjusted, or first cavity 5 is flooded with the desired gas and the desired internal pressure via the access channel. Furthermore, for example, in a third method step 103, access opening 11 is sealed by introducing energy or heat with the aid of a laser into an absorbing part of substrate 3 or cap 7. Alternatively, for example, it is also provided that in the third method step 103, the area around the access channel may be heated only locally by a laser, and the access channel is hermetically sealed. It is thus advantageously possible to also provide the method according to the present invention with energy sources other than a laser for sealing access opening 11. FIG. 2 shows micromechanical component 1 after third method step 103 by way of example.

Chronologically after third method step 103, it is possible for mechanical stresses to occur in a lateral area 15, shown by way of example in FIG. 2, on a surface of cap 7 facing away from cavity 5 and in the depth perpendicularly to a projection of lateral area 15 onto the surface, i.e., along access opening 11 and in the direction of first cavity 5 of micromechanical component 1. These mechanical stresses, in particular local mechanical stresses, prevail in particular on and in the vicinity of an interface between a material area 13 of cap 7, which in third method step 103 transitions into a liquid aggregate state and after third method step 103 transitions into a solid aggregate state and seals access opening 11, and a remaining area of cap 7, which remains in a solid aggregate state during third method step 103. In FIG. 2, material area 13 of cap 7 sealing access opening 11 is to be regarded only schematically or is shown only schematically, in particular with respect to its lateral extension or form, extending in particular in parallel to the surface, and in particular with respect to its expansion or configuration perpendicularly to the lateral extension, running in particular perpendicularly to the surface.

Figure 4:
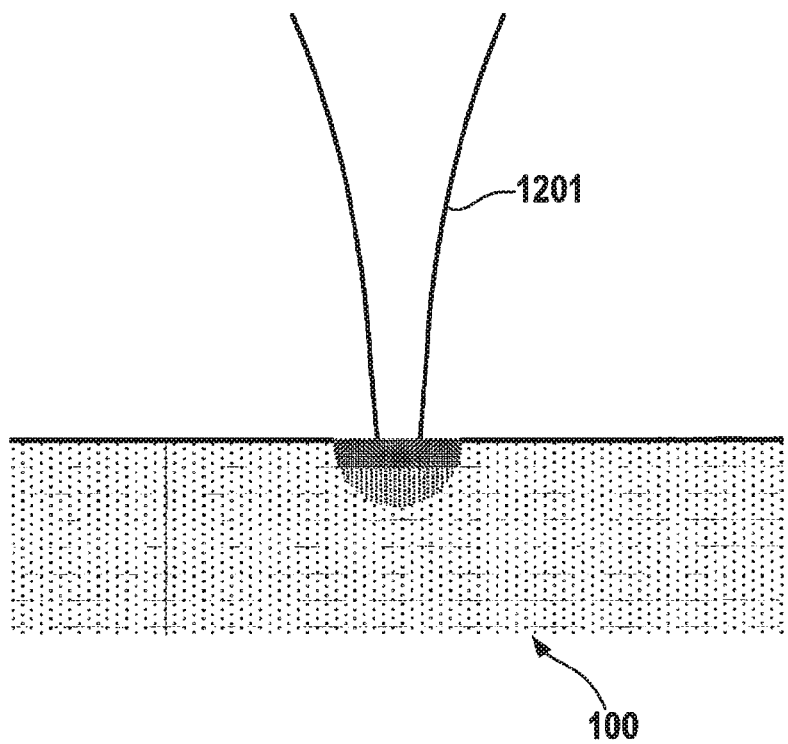
FIGS. 4, 5 6 each show an adjustment of an extension of an absorbing part and an adjustment of an absorption strength in the absorbing part according to exemplary specific embodiments of the present invention in schematic representations.
Figure 5:
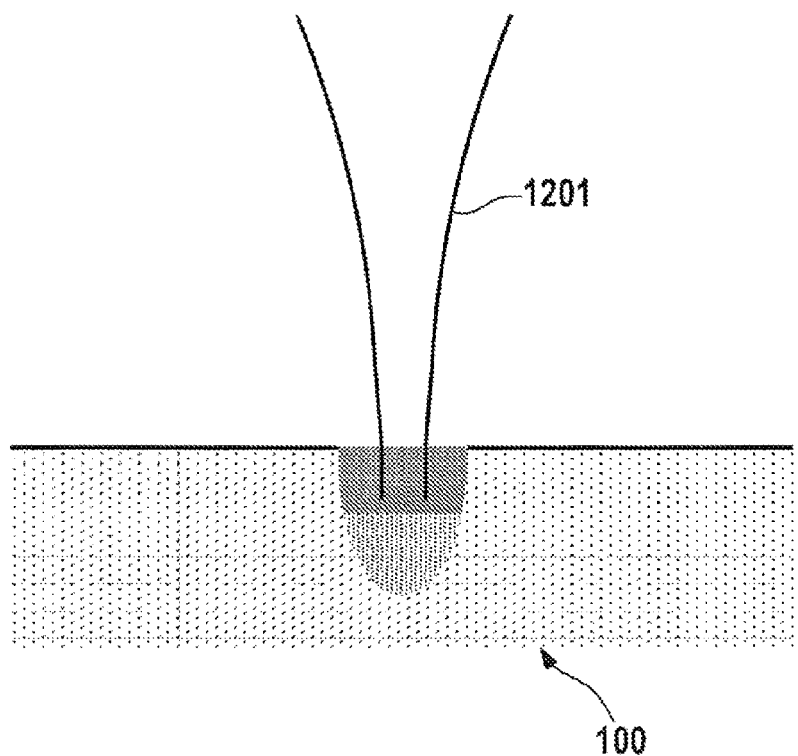
Figure 6:
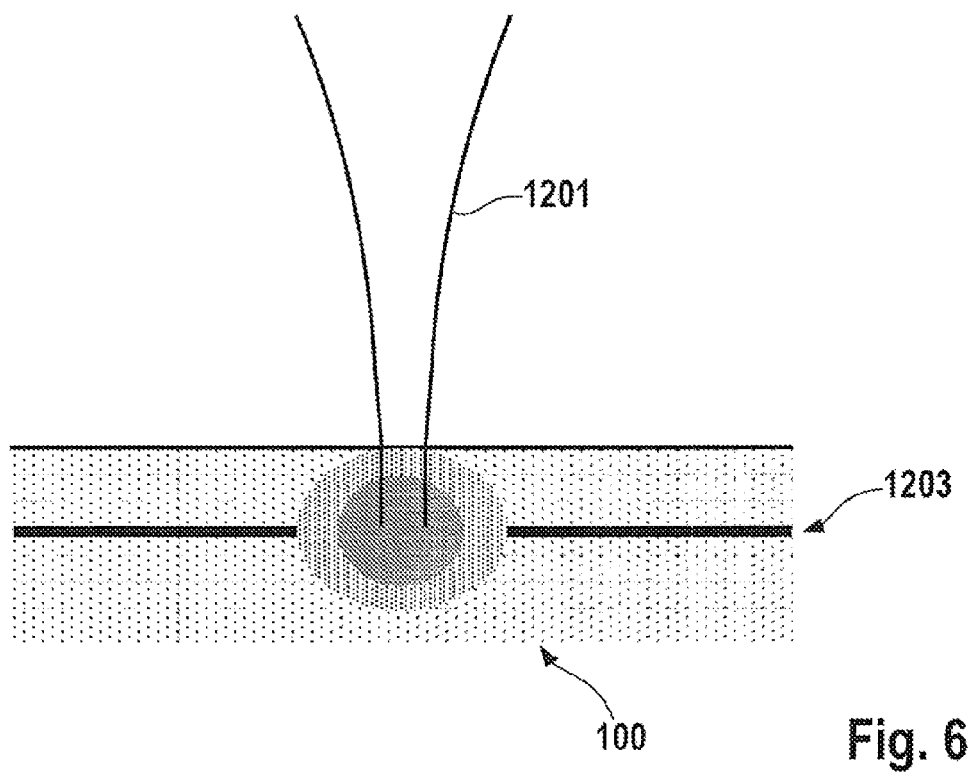

In FIG. 4, FIG. 5 and FIG. 6, an adjustment of an extension of the absorbing part and an adjustment of an absorption strength in the absorbing part according to exemplary specific embodiment of the present invention are shown in schematic representations. In this case, it is provided that the introduction of the energy or heat occurs by adjusting the extension of the absorbing part essentially perpendicular to a main extension plane 100 of substrate 3 or of cap 7 and by adjusting the absorption strength in the absorbing part essentially perpendicular to main extension plane 100 to minimize mechanical stresses occurring in substrate 3 or in cap 7. In other words, method variants of third method step 103 are shown in FIG. 4, FIG. 5 and FIG. 6, the introduction of energy or introduction of heat, for example, by a laser beam 1201, taking place through the targeted influence of the absorption behavior of substrate 3 or cap 7 in such a way that the stresses left in substrate 3 or in cap 7 are minimized or reduced to a non-critical level.

For example, alternatively or in addition, method variants of third method step 103 are also provided, the heat introduction or energy introduction, for example, may be done by a laser beam 1201, taking place through the targeted influence of the reflection behavior and/or of the transmission behavior of substrate 3 or cap 7 in such a way that the stresses left in substrate 3 or in cap 7 are minimized or reduced to a non-critical level.

It is provided, for example, that the adjustment of the extension of the absorbing part and the adjustment of the strength of the absorption in the absorbing part takes place as a function of an applied laser wavelength of laser beam 1201. This makes it possible, for example, to influence the absorption behavior of the substrate or of the cap with the aid of the applied laser wavelength during the laser material processing. In this case, for example, a change of the wavelength or of the laser wavelength globally affects the absorption behavior of the substrate or of the cap. It is provided, for example, that the quantity of heat introduced into the material or into substrate 3 or into cap 7 with the aid of the targeted adjustment of the laser wavelength is adjusted in such a way that after cooling, i.e., chronologically after third method step 103, stresses remaining in the material or in substrate 3 or in cap 7 are reduced compared to the related art. Moreover, it is also provided, for example, that substrate 3 or cap 7 includes silicon. In this case, it is provided, for example, that the laser wavelength is less than 1000 nm. The energy or heat is particularly strongly absorbed at a surface of the substrate or of the cap facing away from first cavity 5. The resultant heat distribution into the depth of substrate 3 or of cap 7, for example, i.e., from the surface facing away from first cavity 5 in the direction of first cavity 5, is determined by the heat conduction in substrate 3 or in cap 7. This is shown by way of example in FIG. 4.

The control of the introduction of the energy or heat by an applied laser wavelength of laser beam 1201 and of the use of substrate 3 including a silicon or cap 7 including a silicon is aided by the fact that silicon is a semiconductor material and, therefore, the absorption behavior of substrate 3 or of cap 7 is greatly a function of the wavelength and, therefore, of the quantum energy of the photons. It is provided, for example, that the laser wavelength is greater than 1000 nm. In this case, it is advantageous that the absorption of silicon decreases sharply for wavelengths greater than 1000 nm, since the photon energy is no longer sufficient to overcome the direct band gap. Thus, it is possible, for example, to specifically adjust the laser light to a deeper penetration by using a longer wavelength. This is shown by way of example in FIG. 5. In this case the extension of the absorbing part essentially perpendicular to main extension plane 100 shown in FIG. 5 is enlarged as compared to the extension of the absorbing part essentially perpendicular to main extension plane 100 shown in FIG. 4. An enlarged extension is achieved in this case, for example, using a greater laser wavelength.

According to the present invention, the control of the energy penetration depth is provided, for example, by the adaptation of the laser wavelength. In this case, the laser wavelength is selected in such a way that the desired energy penetration depth is achieved. According to the present invention, the use of an infrared laser is provided, for example. It is provided, for example, that the laser wavelength is between 780 nm and 1600 nm, which may be between 1030 nm and 1500 nm, particularly between 1080 nm and 1100 nm. Alternatively, it is also provided, for example, that the laser wavelength is between 1030 nm and 1080 nm. Moreover, it is alternatively provided that the laser wave length is between 1100 nm and 1500 nm. According to the present invention, however, it is also provided, for example, that the laser wavelength is adapted via non-linear optical effects and tunable light sources or elements of tunable light sources such as, for example, an optical parametric oscillator (OPO) and/or an optical parametric amplifier (OPA), specifically to the material used in the substrate or in the cap, or to the desired extension of the absorbing part and the absorption strength in the absorbing part.

In addition, it is provided for example, that the adjusting of the extension of the absorbing part and the adjusting of the absorption strength in the absorbing part take place as a function of a material of substrate 3 or of cap 7. It is provided, in particular, that the material of substrate 3 or of cap 7 includes silicon. It is provided, for example, that a spatially structured absorption behavior is adjustable through local material modifications and changes of material.

It is further also provided, for example, that the adjustment of the extension of the absorbing part and the adjustment of the absorption strength in the absorbing part take place as a function of a doping of substrate 3 or of cap 7. The advantageous result of this is that the electron density in the conduction band and/or the hole density in the valence band is increased and, therefore, the absorption in the long wave range is increased. This is achieved, for example, in that substrate 3 or cap 7 includes silicon and substrate 3 or the cap is doped with foreign atoms.

Moreover, it is provided, for example, that the adjustment of the extension of the absorbing part and the adjustment of the absorption strength in the absorbing part take place as a function of a temperature of substrate 3 or of cap 7. In this case, it is provided, for example, that substrate 3 or cap 7 is heated using a heat source before and/or during third method step 103. This is provided, for example, by heating sources contacting substrate 3 or cap 7 such as, for example, a heating plate, or also by heating sources not contacting substrate 3 or cap 7 such as, for example, an infrared lamp. Alternatively or in addition, a combination of a contacting and non-contacting heat source such as, for example, a furnace, is also provided. When using a temperature of substrate 3 or of cap 7, the use of silicon, for example, advantageously exploits the fact that silicon absorbs more intensely with increasing temperature, even in the long wave range. This is advantageously achieved in that more phonons are present at an increased temperature in order to facilitate a transition via the indirect band gap, and in that more electrons are located in the conduction band, thus making intra-band transitions available for the absorption.

In addition, it is also provided, for example, that the adjustment of the extension of the absorbing part and the adjustment of the absorption strength in the absorbing part take place as a function of a layer 1203 and/or a structure in substrate 3 and/or on substrate 3 or in cap 7 and/or on cap 7. A layer 1203 in cap 7 is shown by way of example in FIG. 6. This advantageously makes it possible that, in contrast to a use with a homogenous material, the most energy may also be absorbed further in the interior of the material, i.e., not at the surface of substrate 3 or of cap 7. In homogenous materials, the most energy is absorbed essentially at the irradiated surface according to the Beer-Lambert law.

When using absorbing layers and/or structures, it is provided, for example, that a maximum of the energy deposition is provided in the depth of the component. In other words, it is provided, for example, that the absorption strength in the absorbing part has a maximum in an area spaced apart from the surface facing away from first cavity 5 and essentially in the direction of first cavity 5. For this purpose, it is provided, for example, that low doped silicon is used as a base material or that substrate 3 or the cap includes low doped silicon, and that a laser wavelength, for example, a laser wavelength between 1200 nm and 1400 nm, is used, for which the low doped silicon is essentially transparent, and that a highly absorbing layer or structure is deposited in the target depth, the desired energy distribution being adjusted by the highly absorbing layer. This is shown, for example, in FIG. 6. This advantageously enables the laser light to be able to penetrate as far as the absorption layer/absorption structure with no appreciable weakening and is absorbed specifically in the area of the absorption layer/absorption structure. It is provided, for example, that the highly absorbing layer or structure includes strongly doped silicon and/or a foreign material and/or a metal.

According to the present invention, it is further provided that the adjustment of the extension of the absorbing part and the adjustment of the absorption strength in the absorbing part take place as a function of layer 1203 and/or of the structure in such a way that layer 1203 and/or the structure is a deposited layer and/or structure. An absorption control is provided, for example, by an absorbing layer or by multiple absorbing layers. In this case, it is provided, for example, that the layer or the layers is/are buried in micromechanical component 1 or situated spaced apart from surfaces of micromechanical component 1. In this case, it is provided, for example, that in a fourth method step, substrate 3 or cap 7 is coated with an absorbing layer or with multiple absorbing layers, and that in a fifth method step, the absorbing layer or the multiple absorbing layers is/are coated with an additional layer. In this case, it is provided, for example, that the additional layer includes silicon or polysilicon or polycrystalline silicon. It is also provided, for example, that in a sixth method step, an additional absorbing layer is deposited on the additional layer, and that in a seventh method step, a third layer is deposited on the additional absorbing layer. It is also provided, for example, that in addition, further absorbing layers and still further layers are deposited on corresponding absorbing layers or corresponding layers, respectively. In this way, it is advantageously possible to create arbitrary depth profiles.

Moreover, it is provided according to the present invention that the adjustment of the extension of the absorbing part and the adjustment of the absorption strength in the absorbing part take place as a function of layer 1203 and/or of the structure in such a way that layer 1203 and/or structure is a doped layer and/or doped structure. In this way, different absorption profiles may be made possible by corresponding doping profiles. It is provided, for example, that the doped layer and/or doped structure includes doped silicon. As a result, the degree of absorption, for example, may be greatly influenced by the doping concentration. As a result, it is advantageously possible that arbitrary depth profiles of absorption or energy deposition may be adjusted by an adjustment of doping profiles. It is provided, for example, that the doping profiles are created by the build-up of corresponding layers on a silicon substrate by thermally activated diffusion of an applied doping substance source or by ion implantation.

According to the present invention, it is also provided, for example, that the quantity of heat introduced for a given desired melting depth is minimized. The stresses introduced into the material and remaining after cooling are greatly a function of the introduced quantity of heat, so that these stresses as well may be reduced by a correspondingly adapted absorption management. In addition to the amount, the sign and the direction of the stresses occurring in substrate 3 or in cap 7 after third method step 103, the location or spatial distribution thereof is also crucial in terms of their impact on crack generation and component failure. Thus, stresses in the depth of a component are fundamentally more non-critical than at the surface. Thus, the crack susceptibility may be reduced by a "burial" of the absorption zone in the depth of the component.

Finally, it is also provided according to the present invention that the absorption behavior or the transmission behavior or the reflection behavior of substrate 3 or of cap 7 takes place as a function of additional parameters.

What is claimed is:

1. A method for manufacturing a micromechanical component, which includes a substrate and a cap, which is connected to the substrate and which, together with the substrate, encloses a first cavity, a first pressure prevailing and a first gas mixture having a first chemical composition being enclosed in the first cavity, the method comprising:
    forming, in a first task, an access opening connecting the first cavity to surroundings of the micromechanical component in the substrate or in the cap;
    adjusting, in a second task, the first pressure and/or the first chemical composition in the first cavity; and
    sealing, in a third task, the access opening by introducing energy or heat into an absorbing part of the substrate or the cap, with a laser;
    wherein the introduction of the energy or heat takes place by adjusting an extension of the absorbing part and by adjusting the absorption strength in the absorbing part to minimize stresses occurring in the substrate or in the cap, and
    wherein the adjustment of the extension of the absorbing part and the adjustment of the absorption strength in the absorbing part take place as a function of a temperature of the substrate or of the cap.

2. The method of claim 1, wherein the adjustment of the extension of the absorbing part and the adjustment of the absorption strength in the absorbing part take place as a function of an applied laser wavelength of a laser beam.

3. The method of claim 1, wherein the adjustment of the extension of the absorbing part and the adjustment of the absorption strength in the absorbing part take place as a function of a material of the substrate or of the cap.

4. The method of claim 1, wherein the adjustment of the extension of the absorbing part and the adjustment of the absorption strength in the absorbing part take place as a function of a doping of the substrate or of the cap.

5. The method of claim 1, wherein the adjustment of the extension of the absorbing part and the adjustment of the absorption strength in the absorbing part take place as a function of a layer and/or a structure in the substrate and/or on the substrate or in the cap and/or on the cap.

6. The method of claim 1, wherein the adjustment of the extension of the absorbing part and the adjustment of the absorption strength in the absorbing part take place as a function of the layer and/or of the structure so that the layer and/or the structure is a deposited layer and/or structure.

7. The method of claim 1, wherein the adjustment of the extension of the absorbing part and the adjustment of the absorption strength in the absorbing part take place as a function of the layer and/or of the structure so that the layer and/or the structure is a doped layer and/or structure.

8. A micromechanical component, comprising:
    a substrate;
    a cap, which is connected to the substrate and, together with the substrate, encloses a first cavity, a first pressure prevailing and a first gas mixture having a first chemical composition being enclosed in the first cavity, the substrate or the cap including a sealed access opening;
    wherein the substrate or the cap includes a material area that solidifies and seals the access opening to minimize stresses occurring in the substrate or in the cap after an introduction of energy or heat into an absorbing part of the substrate or of the cap by adjusting the extension of the absorbing part and by adjusting the absorption strength in the absorbing part, and wherein the adjustment of the extension of the absorbing part and the adjustment of the absorption strength in the absorbing part take place as a function of a temperature of the substrate or of the cap.

9. The micromechanical component of claim 8, further comprising:
   at least one of the following:
      a material of the substrate or of the cap for introducing the energy or heat;
      a doping of the substrate or of the cap for introducing the energy or heat; and
      a layer and/or structure in the substrate and/or on the substrate or in the cap and/or on the cap for introducing the energy or heat.

* * * * *